(12) United States Patent
Lou et al.

(10) Patent No.: US 12,317,465 B2
(45) Date of Patent: May 27, 2025

(54) SLOTTED ABSORBER

(71) Applicant: Cisco Technology, Inc., San Jose, CA (US)

(72) Inventors: Jianquan Lou, Shanghai (CN); Xiao Li, Milpitas, CA (US); Alpesh U. Bhobe, Sunnyvale, CA (US)

(73) Assignee: Cisco Technology, Inc., San Jose, CA (US)

( * ) Notice: Subject to any disclaimer, the term of this patent is extended or adjusted under 35 U.S.C. 154(b) by 243 days.

(21) Appl. No.: 18/059,703

(22) Filed: Nov. 29, 2022

(65) Prior Publication Data

US 2024/0179883 A1    May 30, 2024

(51) Int. Cl.
| | | |
|---|---|---|
| *H05K 9/00* | (2006.01) | |
| *H01L 23/552* | (2006.01) | |
| *H05K 1/02* | (2006.01) | |
| *H05K 7/20* | (2006.01) | |

(52) U.S. Cl.
CPC ......... *H05K 9/0081* (2013.01); *H01L 23/552* (2013.01); *H05K 1/0203* (2013.01); *H05K 7/2039* (2013.01)

(58) Field of Classification Search
CPC ........... H01L 2924/3025; H01L 21/563; H01L 23/552; H01R 12/52; H01R 12/62; H01R 13/2414; H05K 1/0203; H05K 1/0243; H05K 1/144; H05K 1/02; H05K 2201/066; H05K 2201/10098; H05K 7/2039; H05K 9/0024; H05K 9/0031; H05K 9/0056; H05K 9/0088; H05K 9/0081; H05K 9/0018; H05K 1/0216; H05K 9/0022; H05K 9/0026
See application file for complete search history.

(56) References Cited

U.S. PATENT DOCUMENTS

| | | | | |
|---|---|---|---|---|
| 4,699,593 A | * | 10/1987 | Grabbe | H05K 7/1069 |
| | | | | 439/71 |
| 9,287,194 B2 | * | 3/2016 | Hung | H01L 21/563 |
| 9,972,577 B1 | * | 5/2018 | Lu | H01L 21/4817 |
| 10,653,048 B1 | * | 5/2020 | Green | H05K 9/0032 |
| 2002/0140061 A1 | * | 10/2002 | Lee | H01L 23/49541 |
| | | | | 257/676 |
| 2004/0160377 A1 | * | 8/2004 | Aisenbrey | H05K 3/101 |
| | | | | 343/789 |
| 2005/0199998 A1 | * | 9/2005 | Chen | H01L 23/16 |
| | | | | 257/706 |
| 2008/0266830 A1 | | 10/2008 | Woods | |

(Continued)

FOREIGN PATENT DOCUMENTS

WO    2020123500 A1    6/2020

OTHER PUBLICATIONS

An Electromagnetic Shielding Device With Radiation Function, CN-201733567-U, Chen et al. (Year: 2011).*

(Continued)

*Primary Examiner* — Michael A Matey

(74) *Attorney, Agent, or Firm* — Patterson + Sheridan, LLP

(57) ABSTRACT

An electromagnetic absorber includes a body arranged to surround a perimeter of an integrated circuit chip. The body is arranged to absorb electromagnetic radiation leaking from the integrated circuit chip. The body defines an aperture through which the integrated circuit chip extends and a plurality of slots positioned around the aperture.

19 Claims, 8 Drawing Sheets

(56) References Cited

U.S. PATENT DOCUMENTS

| | | | | |
|---|---|---|---|---|
| 2009/0284404 A1* | 11/2009 | Sim | ............... | H01Q 17/00 |
| | | | | 342/1 |
| 2009/0289335 A1* | 11/2009 | Camacho | ......... | H01L 23/49551 |
| | | | | 257/659 |
| 2010/0307719 A1 | 12/2010 | Yang et al. | | |
| 2016/0037692 A1* | 2/2016 | Zhang | ............... | H05K 1/023 |
| | | | | 174/394 |
| 2017/0251576 A1* | 8/2017 | Jeong | ............... | H05K 1/09 |
| 2018/0006354 A1* | 1/2018 | Nivet | ............... | G06F 1/1698 |
| 2018/0228063 A1 | 8/2018 | Dixon et al. | | |
| 2023/0187375 A1* | 6/2023 | Tejasvi | ............... | H01L 23/552 |
| | | | | 257/659 |
| 2024/0057292 A1* | 2/2024 | Jia | ............... | H05K 7/1405 |

OTHER PUBLICATIONS

Electromagnetic Shielding Device with Radiating function, CN-202663712-U, Guo et al. (Year: 2013).*

Y. Arien, P. Dixon, M. Khorrami, A. Degraeve and D. Pissoort, "Study on the reduction of heatsink radiation by combining grounding pins and absorbing materials," 2015 IEEE International Symposium on Electromagnetic Compatibility (EMC), 2015, pp. 773-778, doi: 10.1109/ISEMC.2015.7256261.

Shuyun Huo et al., "Analysis of a Novel Resistive Film Absorber for Suppression of Electromagnetic Radiation in System-In-Package," Hindawi, Dated: Mar. 7, 2022, pp. 1-15.

* cited by examiner

SLOTTED ABSORBER

TECHNICAL FIELD

Embodiments presented in this disclosure generally relate to noise absorbers. More specifically, embodiments disclosed herein relate to a slotted absorber.

BACKGROUND

Absorbers are positioned near components (e.g., integrated circuits) to absorb electromagnetic radiation produced by these components. By absorbing the electromagnetic radiation, the absorbers reduce the amount of electromagnetic interference experienced by other, nearby components, such as switches and ports.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

Figure 1:
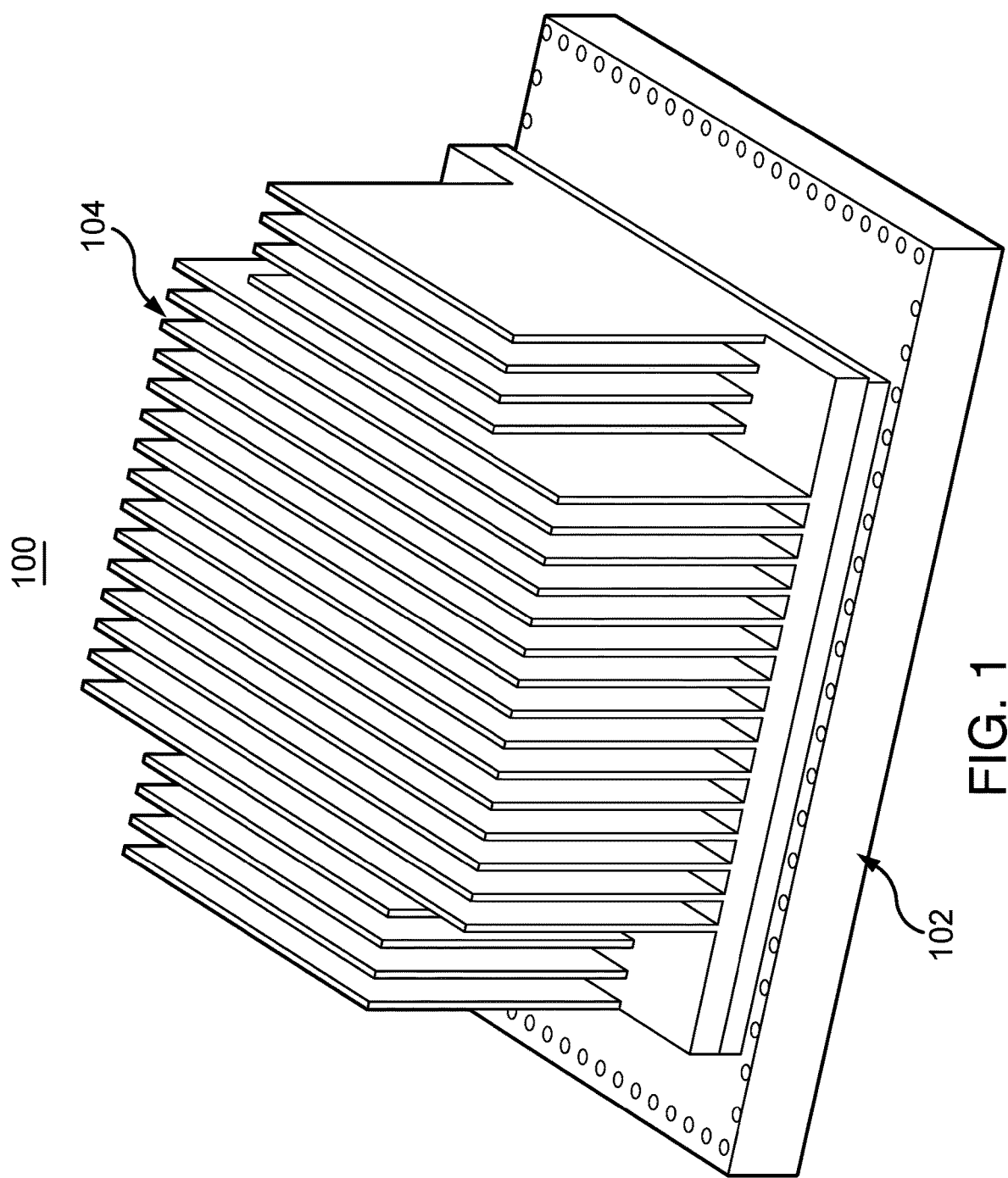
FIG. 1 illustrates an example system.

According to an embodiment, an electromagnetic absorber includes a body arranged to surround a perimeter of an integrated circuit chip. The body is arranged to absorb electromagnetic radiation leaking from the integrated circuit chip. The body defines an aperture through which the integrated circuit chip extends and a plurality of slots positioned around the aperture.

According to another embodiment, an absorber includes a body defining a plurality of slots extending along a length of the body. The body is arranged to be positioned in an air vent of a chassis such that the body absorbs noise produced from within the chassis.

According to another embodiment, a method includes forming an electromagnetic absorber that defines an aperture and forming a plurality of slots positioned around the aperture. The method also includes positioning the electromagnetic absorber around an integrated circuit chip such that the integrated circuit chip extends into the aperture.

EXAMPLE EMBODIMENTS

Electromagnetic absorbers are positioned near components (e.g., integrated circuits (ICs)) to absorb electromagnetic radiation produced by these components, which reduces the amount of electromagnetic interference experienced by other, nearby components, such as switches and ports. With increasing demands of transmitting data at higher data rates, network devices (e.g., optical switches) include higher port density. For example, some existing devices may have more than sixty ports, and a modular chassis may have over one hundred ports. Additionally, data is transmitted at higher data rates, and these ports may run at faster speeds.

The continuing increasing complexity and integration density of ICs inevitably leads to the creation of a significant amount of heat. As a result, heatsinks are frequently positioned on the ICs to maintain an acceptable IC temperature. Unfortunately, the heatsink may become a very efficient antenna over a large frequency range.

High port density, high data rates, and the heatsink may result in the ICs containing more high speed serializer-deserializer modules that radiate easily, which creates challenges in managing electromagnetic radiation emitted by these ICs and may cause electromagnetic interference to exceed acceptable levels.

The present disclosure describes a slotted absorber that improves electromagnetic absorption or noise absorption relative to existing absorbers, in certain embodiments. Generally, the absorber defines a series of slots that extend across a length or width of the absorber. In certain embodiments, the slots improve the electromagnetic absorption of the absorber (e.g., by taking advantage of multireflection properties that increase the number of opportunities for the absorber to absorb electromagnetic radiation) or the noise absorption of the absorber.

As an example, the absorber may define a central cavity so that the absorber may be installed around an IC to absorb electromagnetic radiation produced by the IC. The slots in the absorber may be positioned around the IC. As the IC operates (e.g., at high frequencies), the IC may leak electromagnetic radiation. The absorber may absorb the electromagnetic radiation so that the electromagnetic radiation does not leak and affect other electrical components in the system. As a result, the absorber reduces the electromagnetic interference caused by the IC.

As another example, the absorber may be installed in an air vent of a chassis to absorb noise produced by components within the chassis. The chassis may hold electrical equipment or optical equipment. The air vent may allow air flow to the equipment inside the chassis to regulate the temperature of the equipment. The equipment may produce noise during operation, and that noise may be amplified through the air vent (e.g., by a horn antenna effect). The absorber may be positioned in the air vent to absorb or dampen that noise. As a result, the absorber reduces the level of noise emitted from the chassis.

FIG. 1 illustrates an example system 100. As seen in FIG. 1, the system 100 includes a board 102 (e.g., a printed circuit board) and a heatsink 104. The board 102 provides a foundation onto which other components of the system 100 may be mounted. For example, the heatsink 104 may be mounted or positioned on an electromagnetic absorber and an IC that are mounted or positioned on the board 102. The board 102 may provide traces that electrically connect the IC to other components in the system 100 or on the board 102.

The absorber may be positioned on the board 102 around the IC. The absorber absorbs electromagnetic radiation produced by the IC. There may be slots in the absorber that improve the electromagnetic absorption of the absorber (e.g., by taking advantage of multireflection properties that increase the number of opportunities for the absorber to absorb electromagnetic radiation). As a result, the absorber reduces the amount of electromagnetic interference caused by the IC.

The heatsink 104 may be positioned or mounted on the absorber and the IC. The heatsink 104 may be in thermal contact with the IC such that the heatsink 104 absorbs heat energy produced by the IC. The heatsink 104 may conduct the absorbed heat to fins on the heatsink 104. Air may be circulated between or over the fins to remove the absorbed heat. In this manner, the heatsink 104 regulates the temperature of the IC and may prevent the IC from overheating. The heat absorption function of the heatsink 104 is different from the electromagnetic radiation absorption function of the absorber. Although the absorber may absorb heat produced by the IC merely because the absorber is positioned near the IC, the absorber also absorbs electromagnetic radiation (e.g., radio frequency signals and higher frequency signals) leaking from the IC.

Figure 2:
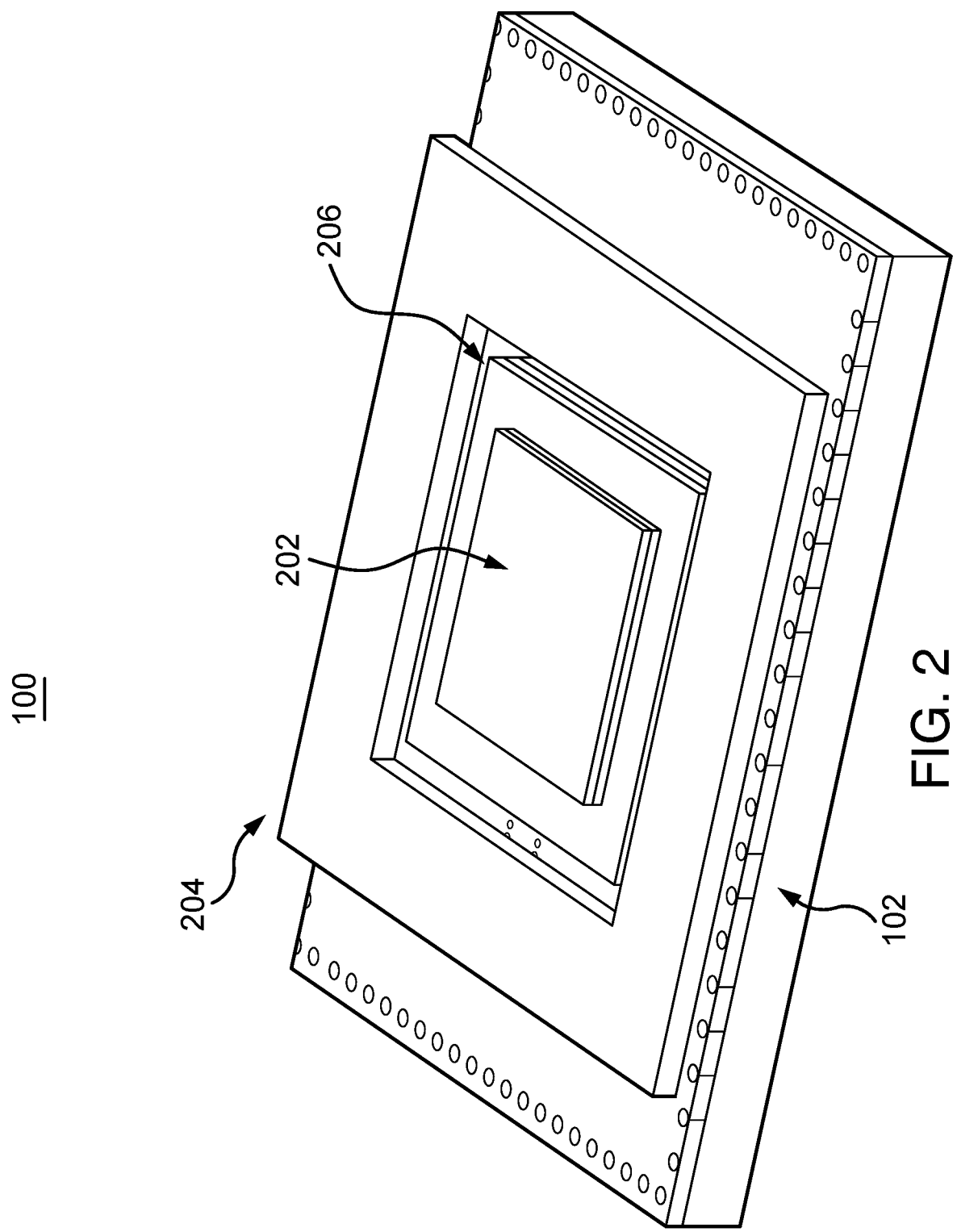
FIG. 2 illustrates a portion of the system of FIG. 1.

FIG. 2 illustrates a portion of the system 100 of FIG. 1. Generally, FIG. 2 shows the system 100 with the heatsink 104 removed. As seen in FIG. 2, the system 100 includes the board 102. An IC 202 and an electromagnetic absorber 204 are mounted or positioned on the board 102. As discussed previously, the board 102 may include traces that electrically connect the IC 202 to other components in the system 100 or on the board 102.

The absorber 204 may be formed using any suitable material. For example, the absorber 204 may have a body formed using foam, rubber, or plastic. The body of the absorber 204 defines a cavity 206. The cavity 206 is formed in a central portion of the absorber 204. The absorber 204 is positioned on the board 102 such that the IC 202 extends through the cavity 206. As a result, the absorber 204 is positioned around a perimeter of the IC 202. The absorber 204 may absorb electromagnetic radiation produced by the IC 202, which reduces the electromagnetic interference experienced by other components of the system 100.

Figure 3:
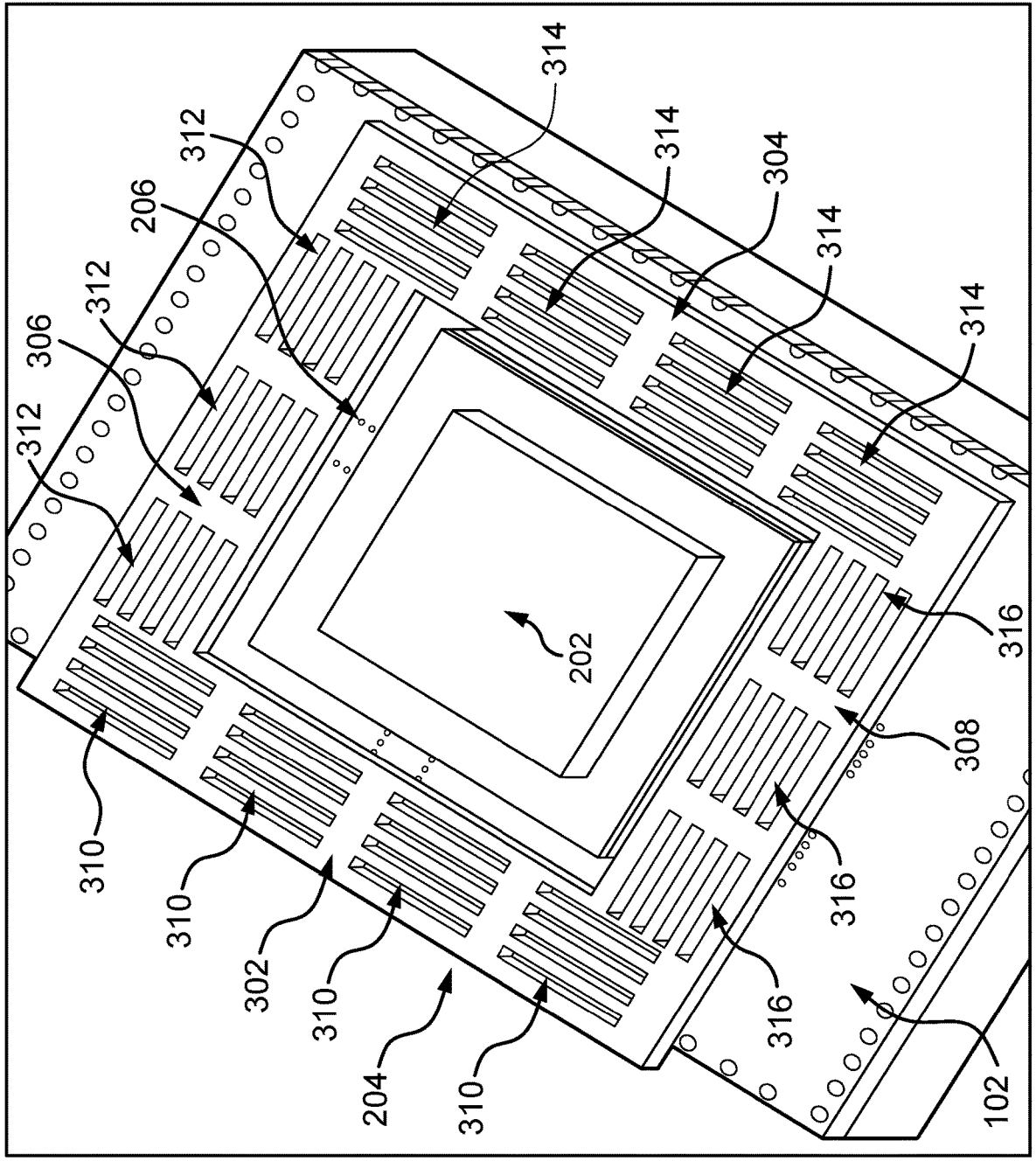
FIG. 3 illustrates an example electromagnetic absorber in the system of FIG. 1.

FIG. 3 illustrates an example electromagnetic absorber 204 in the system 100 of FIG. 1. Generally, the absorber 204 may include slots formed in or through the absorber 204. These slots improve the electromagnetic absorption of the absorber 204, which further reduces the electromagnetic interference experienced by other components of the system 100.

As seen in FIG. 3, the absorber 204 has a body that defines the cavity 206, and the IC 202 extends through the cavity 206. The body of the absorber 204 is arranged around the perimeter of the IC 202. The body of the absorber 204 includes four portions 302, 304, 306, and 308. The portions 302, 304, 306, and 308 form four sides of the absorber 204. The portions 302 and 304 extend along a length of the absorber 204, and the portions 306 and 308 extend along a width of the absorber 204. The portions 302 and 304 are positioned at opposite sides of the absorber 204, and the portions 306 and 308 are positioned at opposite sides of the absorber 204. The portions 306 and 308 are coupled to the portions 302 and 304. Additionally, the portions 306 and 308 are positioned between the portions 302 and 304.

The portion 302 defines slots 310. As seen in FIG. 3, the slots 310 extend along a length of the absorber 204. The slots 310 are arranged in sets that are arranged along the length of the absorber 204. In the example of FIG. 3, the slots 310 are arranged in four sets that are positioned along the length of the absorber 204. Each set includes four slots 310 that are arranged along the width of the absorber 204. By adjusting the lengths and widths of the slots 310, the absorber 204 may define any suitable number of sets of slots 310, and each set of slots 310 may include any suitable number of slots 310.

The portion 304 defines slots 314. As seen in FIG. 3, the slots 314 extend along the length of the absorber 204. The slots 314 are arranged in sets that are arranged along the length of the absorber 204. In the example of FIG. 3, the portion 304 includes four sets of slots 314, and each set of slots 314 includes four slots 314. The slots 314 in a set are arranged along the width of the absorber 204. By adjusting the dimensions of the slots 314, the portion 304 may define any suitable number of sets of slots 314, and each set may include any suitable number of slots 314.

The portion 306 defines slots 312. As seen in FIG. 3, the slots 312 extend along the width of the absorber 204. The slots 312 are arranged in sets. In the example of FIG. 3, the portion 306 defines three sets of slots 312. Each set of slots 312 includes four slots 312. The sets of slots 312 are arranged along the width of the absorber 204. The slots 312 in a set are arranged along the length of the absorber 204. By adjusting the dimensions of the slots 312, the portion 306 may define any suitable number of sets of slots 312, and each set may include any suitable number of slots 312.

The portion 308 defines slots 316. As seen in FIG. 3, the slots 316 extend along the width of the absorber 204. The slots 316 are arranged in sets. In the example of FIG. 3, the portion 308 includes three sets of slots 316. The sets are arranged along the width of the absorber 204. In the example of FIG. 3, each set includes four slots 316. The slots 316 in a set are arranged along the length of the absorber 204. The dimensions or sizes of the slots 316 may be adjusted so that the portion 308 may define any suitable number of sets of slots 316, and each set of slots 316 may include any suitable number of slots 316.

The slots 310, 312, 314, and 316 and the cavity 206 may be formed in the absorber 204 using any suitable process. For example, the absorber 204 may be formed as a solid sheet and the slots 310, 312, 314, and 316 and the cavity 206 may be formed (e.g., cut) into the solid sheet. As another example, the absorber 204 may be formed in a mold with protrusions that cause the absorber 204 to form with the cavity 206 and the slots 310, 312, 314, and 316. The slots 310, 312, 314, and 316 may extend to any suitable depth in the absorber 204. For example, the slots 310, 312, 314, and 316 may extend partway through the absorber 204 or completely through the absorber 204. The slots 310, 312, 314, and 316 may have any suitable size or shape. For example, the slots 310, 312, 314, and 316 may be rectangular or rounded. Moreover, the slots 310, 312, 314, and 316 may have any suitable length (e.g., a length of 10 millimeters) and width (e.g., a width of 1 millimeter). The slots 310, 312, 314, and 316 may also include any suitable separation (e.g., 1 millimeter distance between slots in a set).

As discussed previously, the slots 310, 312, 314, and 316 may improve the electromagnetic absorption of the absorber 204 (e.g., by taking advantage of multireflection properties that increase the number of opportunities for the absorber to absorb electromagnetic radiation). As a result, the slots 310, 312, 314, and 316 reduce the amount of electromagnetic interference caused by the IC 202 and experienced by other components of the system 100. Additionally, by including the slots 310, 312, 314, and 316 in the absorber 204, the amount of material used to form the absorber 204 is reduced.

Figure 4:
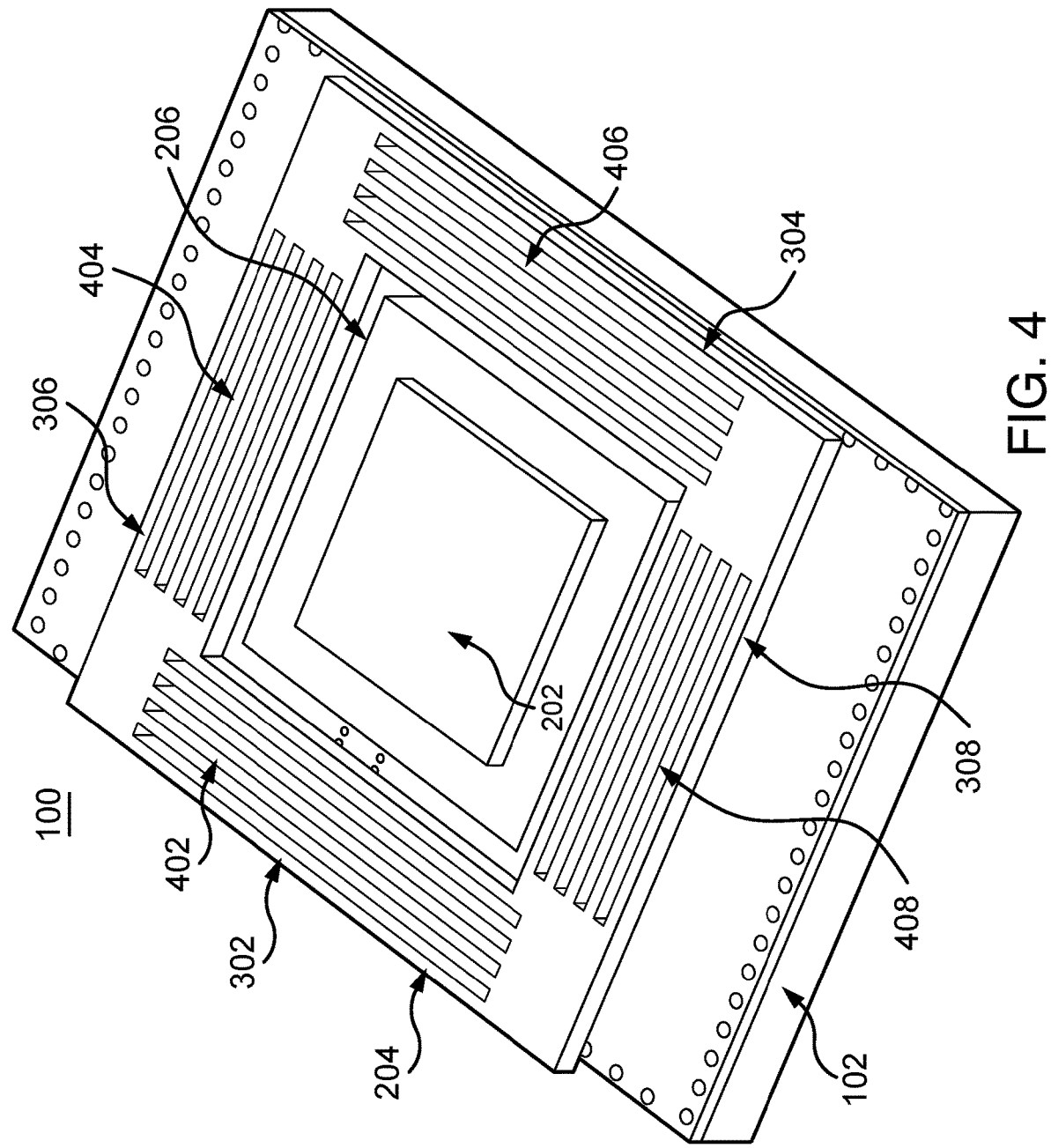
FIG. 4 illustrates an example electromagnetic absorber in the system of FIG. 1.

FIG. 4 illustrates an example electromagnetic absorber 204 in the system 100 of FIG. 1. As seen in FIG. 4, the absorber 204 has a body that defines slots 402, 404, 406, and 408. The slots 402, 404, 406, and 408 may improve the electromagnetic absorption of the absorber 204.

The body of the absorber 204 includes the portions 302, 304, 306, and 308. The portions 302 and 304 extend along the length of the absorber 204. The portions 306 and 308 extend along the width of the absorber 204. The portion 304 is opposite the portion 302, and the portion 308 is opposite the portion 306. The portions 306 and 308 are coupled to the portions 302 and 304 and positioned between the portions 302 and 304. Additionally, the absorber 204 defines a cavity 206 through which the IC 202 extends.

The portion 302 defines slots 402. As seen in FIG. 4, the slots 402 are arranged along the width of the absorber 204 and extend along the length of the absorber 204. Each of the slots 402 extends across a majority of the length of the absorber 204. In the example of FIG. 4, the portion 302 includes four slots 402. The dimensions and sizes of the slots 402 may be adjusted so that the portion 302 may include any suitable number of slots 402.

The portion 304 defines slots 406. As seen in FIG. 4, the slots 406 are arranged along the width of the absorber 204 and extend along the length of the absorber 204. Each slot 406 extends across a majority of the length of the absorber 204. In the example of FIG. 4, the portion 304 includes four slots 406. The dimensions and sizes of the slots 406 may be adjusted so that the portion 304 may include any suitable number of slots 406.

The portion 306 defines slots 404. As seen in FIG. 4, the slots 404 are arranged along the length of the absorber 204 and extend along the width of the absorber 204. Each slot 404 may extend across a majority of the width of the absorber 204. In the example of FIG. 4, the portion 306 includes four slots 404. The dimensions or sizes of the slots 404 may be adjusted so that the portion 306 may include any suitable number of slots 404.

The portion 308 includes slots 408. As seen in FIG. 4, the slots 408 are arranged along the length of the absorber 204 and extend along the width of the absorber 204. Each of the slots 408 may extend across a majority of the width of the absorber 204. In the example of FIG. 4, the portion 308 includes four slots 408. The dimensions or sizes of the slots 408 may be adjusted so that the portion 308 may include any suitable number of slots 408.

The slots 402, 404, 406, and 408 and the cavity 206 may be formed in the absorber 204 using any suitable process. For example, the absorber 204 may be formed as a solid sheet and the slots 402, 404, 406, and 408 and the cavity 206 may be formed (e.g., cut) into the solid sheet. As another example, the absorber 204 may be formed in a mold with protrusions that cause the absorber 204 to form with the cavity 206 and the slots 402, 404, 406, and 408. The slots 402, 404, 406, and 408 may extend to any suitable depth in the absorber 204. For example, the slots 402, 404, 406, and 408 may extend partway through the absorber 204 or completely through the absorber 204. The slots 402, 404, 406, and 408 may have any suitable size or shape. For example, the slots 402, 404, 406, and 408 may be rectangular or rounded. Moreover, the slots 402, 404, 406, and 408 may have any suitable length (e.g., a length of 30 millimeters or 40 millimeters) and width (e.g., a width of 1 millimeter). The slots 402, 404, 406, and 408 may also include any suitable separation (e.g., 1 millimeter distance between slots in a set).

As discussed previously, the slots 402, 404, 406, and 408 improve the electromagnetic absorption of the absorber 204. As a result, the absorber 204 absorbs more of the electromagnetic radiation produced by the IC 202 which reduces the electromagnetic interference experienced by other components of the system 100. Additionally, by including the slots 402, 404, 406, and 408 in the absorber 204, the amount of material used to form the absorber 204 is reduced.

Figure 5:
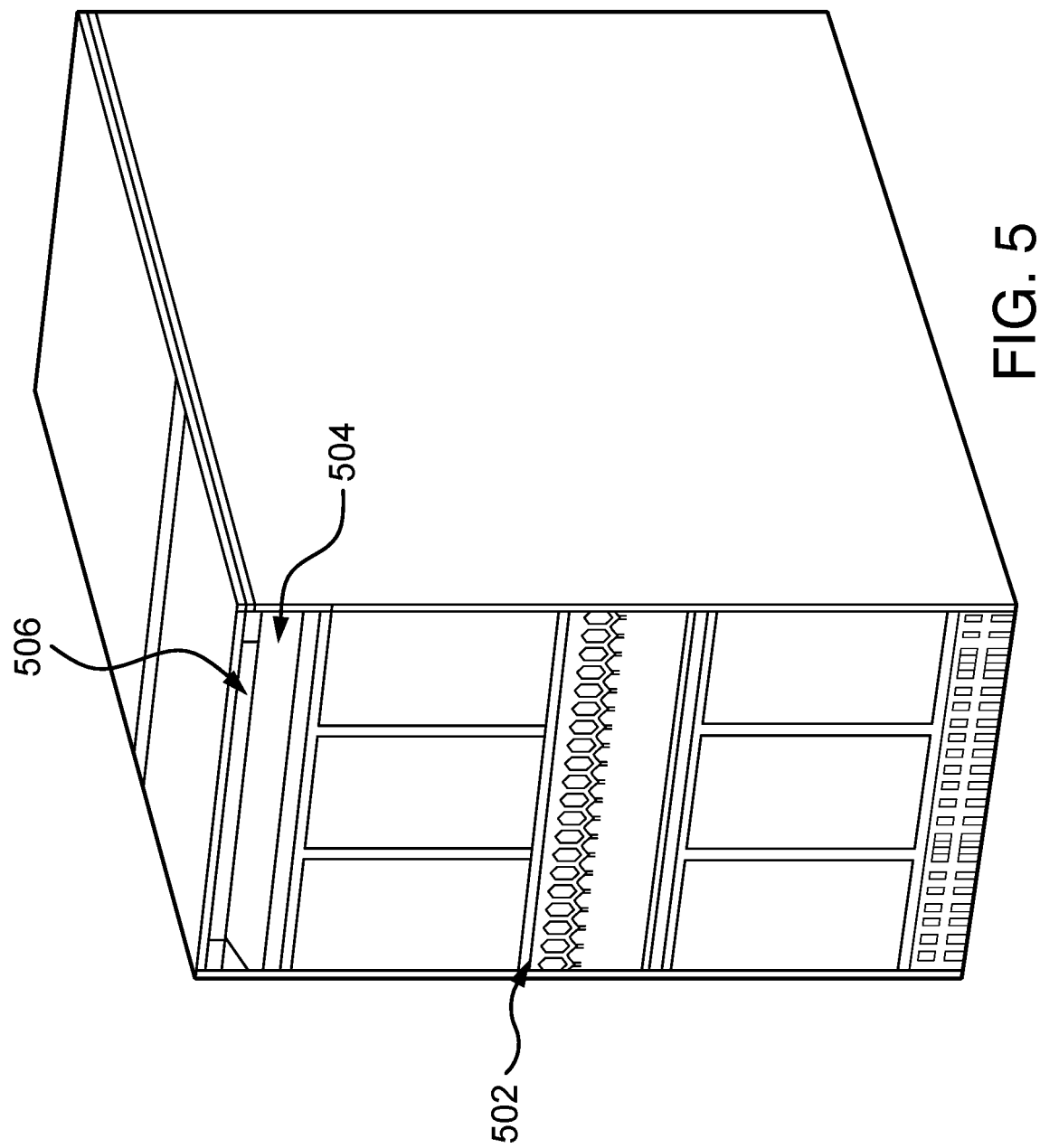
FIG. 5 illustrates an example system.

FIG. 5 illustrates an example system 500. As seen in FIG. 5, the system 500 includes a chassis 502. The chassis 502 defines an air vent 504. An absorber 506 is positioned in the air vent 504.

The chassis 502 may be a metallic or plastic structure that houses other electrical equipment. For example, the chassis 502 may house computer equipment or optical components. The chassis 502 may protect the computer equipment or optical components from external damage or environmental conditions. The computer equipment and optical components may generate heat as they operate. Air may be circulated within the chassis 502 to remove the heat from the computer equipment or optical components. As a result, the temperatures of the computer equipment or optical components is regulated.

The circulated air may enter or leave the chassis 502 through the air vent 504. For example, cool air may enter the chassis 502 through the air vent 504, or warm air may be exhausted from the chassis 502 through the air vent 504. Noise (e.g., audible noise) produced by the computer equipment or optical components may also be emitted through the air vent 504. In some instances, the structure of the air vent 504 may increase the amount of audible noise emitted from the chassis 502. For example, a tilted air vent plate may introduce a horn antenna effect that amplifies the noise emitted from the chassis 502.

The absorber 506 may be positioned in the air vent 504 to absorb the noise. In some embodiments, the absorber 506 may include slots formed in or through the absorber 506, which improve the noise absorption of the absorber 506. As a result, the absorber 506 absorbs the noise before the noise is emitted out of the chassis 502. In this manner, the absorber 506 reduces the noise emitted from the chassis 502.

Figure 6:
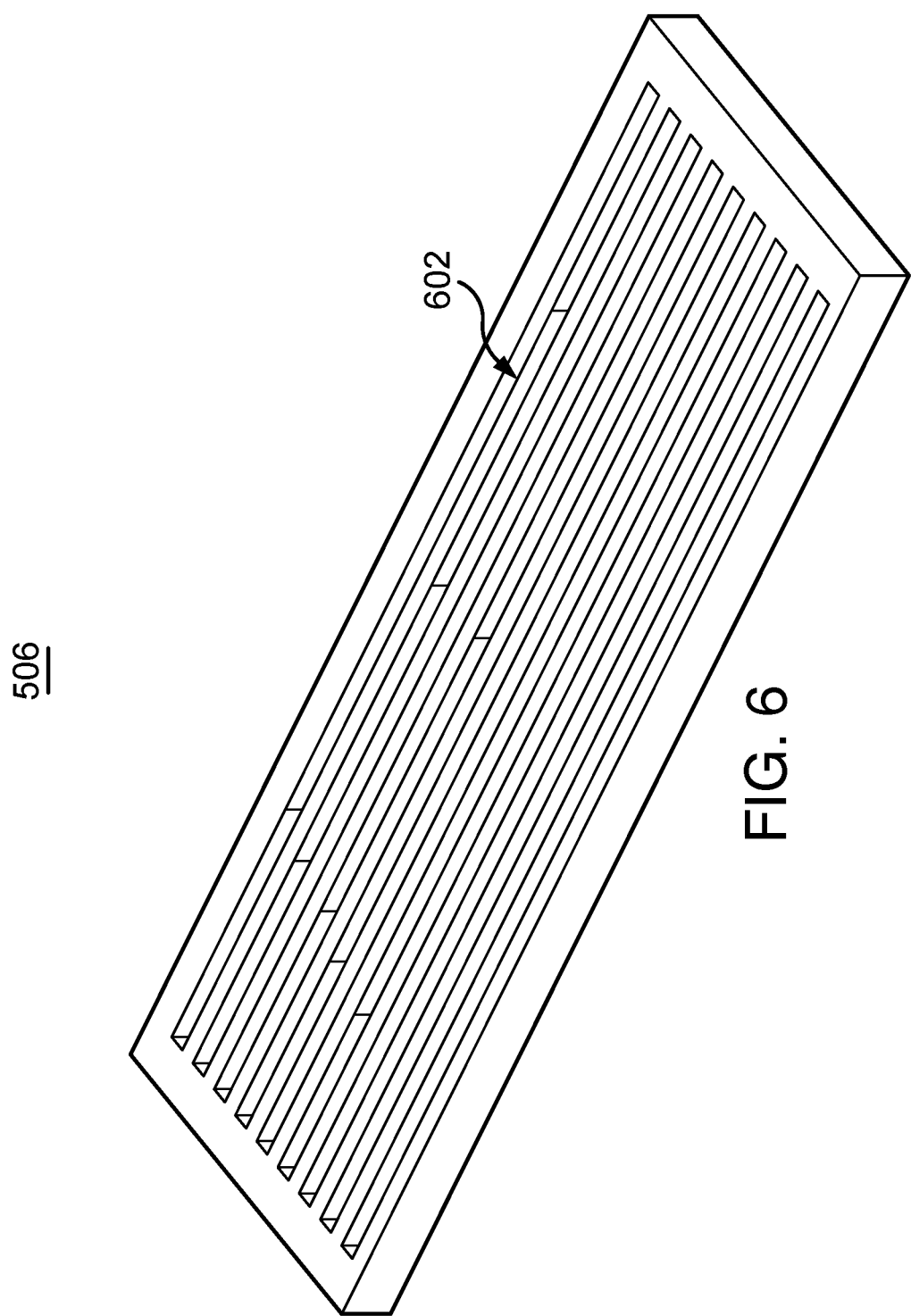
FIG. 6 illustrates an example absorber in the system of FIG. 5.

FIG. 6 illustrates an example absorber 506 in the system 500 of FIG. 5. As seen in FIG. 6, the absorber 506 has a body that defines slots 602. The slots 602 may be arranged along a width of the absorber 506 and may extend along the length of the absorber 506. Each of the slots 602 may extend across a majority of the length of the absorber 506. The absorber 506 may define any suitable number of slots 602. As seen in FIG. 6, the slots 602 may be arranged across a majority of the width of the absorber 506. The slots 602 may extend partially through the absorber 506 or completely through the absorber 506.

Figure 7:
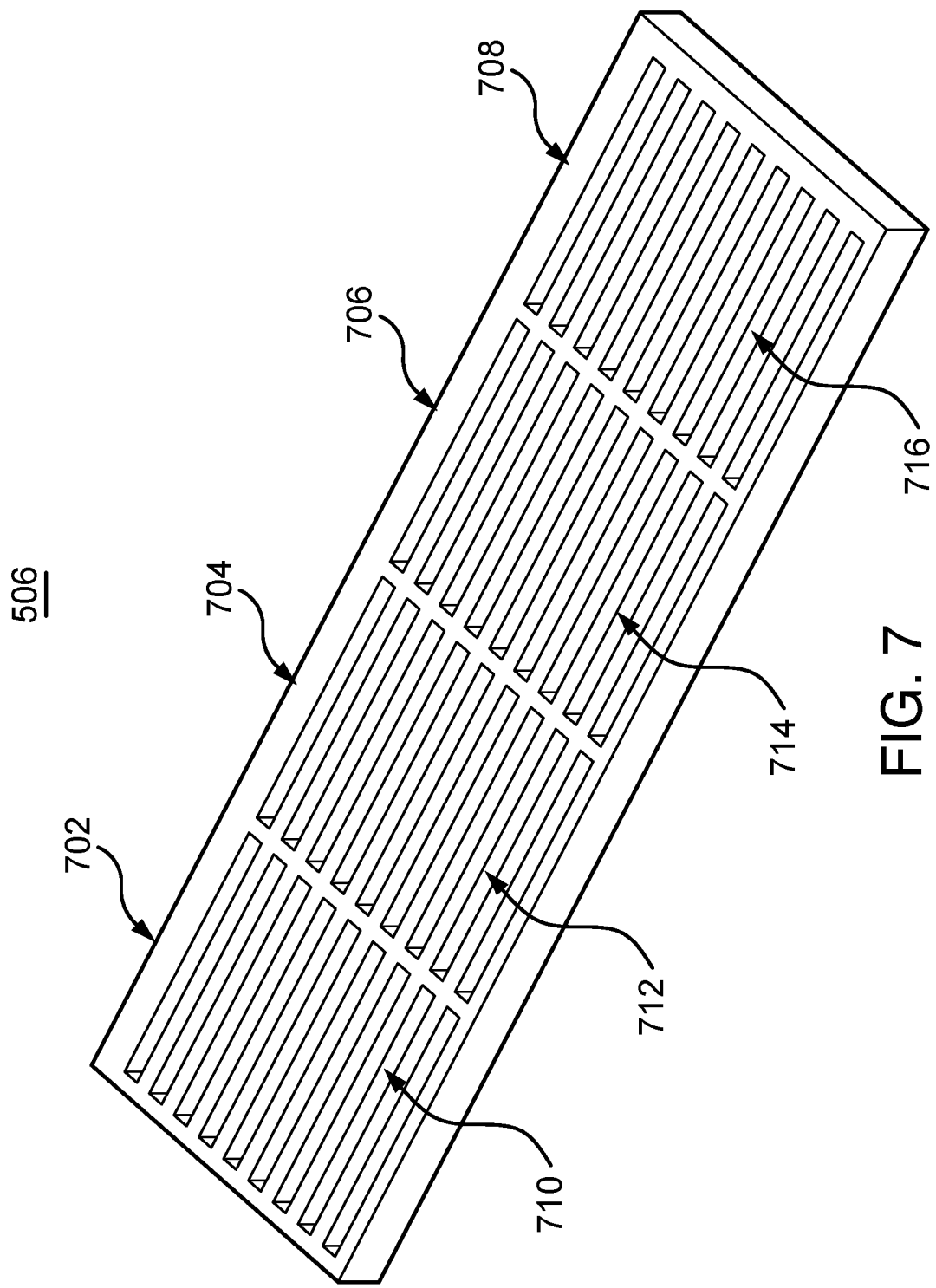
FIG. 7 illustrates an example absorber in the system of FIG. 5.

FIG. 7 illustrates an example absorber 506 in the system 500 of FIG. 5. As seen in FIG. 7, the absorber 506 has a body that includes portions 702, 704, 706, and 708 arranged along the length of the absorber 506. The portion 704 is coupled to the portion 702. The portion 706 is coupled to the portion 704. The portion 708 is coupled to the portion 706.

The portion 702 includes slots 710. The portion 704 includes slots 712. The portion 706 includes slots 714. The portion 708 includes slots 716. The slots 710, 712, 714, and 716 are arranged along the width of the absorber 506 and extend along the length of the absorber 506. In the example of FIG. 7, each of the portions 702, 704, 706, and 708 includes nine slots 710, 712, 714, and 716. The dimensions and sizes of the slots 710, 712, 714, and 716 may be adjusted so that the portion 702, 704, 706, and 708 may include any suitable number of slots 710, 712, 714, and 716.

The slots 602, 710, 712, 714, and 716 may be formed in the absorber 506 using any suitable process. For example, the absorber 506 may be formed as a solid sheet and the slots 602 or the slots 710, 712, 714, and 716 may be formed (e.g., cut) into the solid sheet. As another example, the absorber 506 may be formed in a mold with protrusions that cause the absorber 204 to form with the slots 602 or the slots 710, 712, 714, and 716. The slots 602, 710, 712, 714, and 716 may extend to any suitable depth in the absorber 506. For example, the slots 602, 710, 712, 714, and 716 may extend partway through the absorber 506 or completely through the absorber 506. The slots 602, 710, 712, 714, and 716 may have any suitable size or shape. For example, the slots 602, 710, 712, 714, and 716 may be rectangular or rounded. Moreover, the slots 602, 710, 712, 714, and 716 may have any suitable length (e.g., a length of 60 millimeters or 15 millimeters) and width (e.g., a width of 1 millimeter). The slots 602, 710, 712, 714, and 716 may also include any suitable separation (e.g., 1 millimeter distance between slots).

As discussed previously, the slots 602, 710, 712, 714, and 716 may improve the noise absorption of the absorber 506. As a result, the absorber 506 absorbs more noise before that noise is emitted through the air vent 504 of the chassis 502, which reduces the noise emitted from the chassis 502. Additionally, by including the slots 602 or the slots 710, 712, 714, and 716 in the absorber 506, the amount of material used to form the absorber 506 is reduced.

Figure 8:
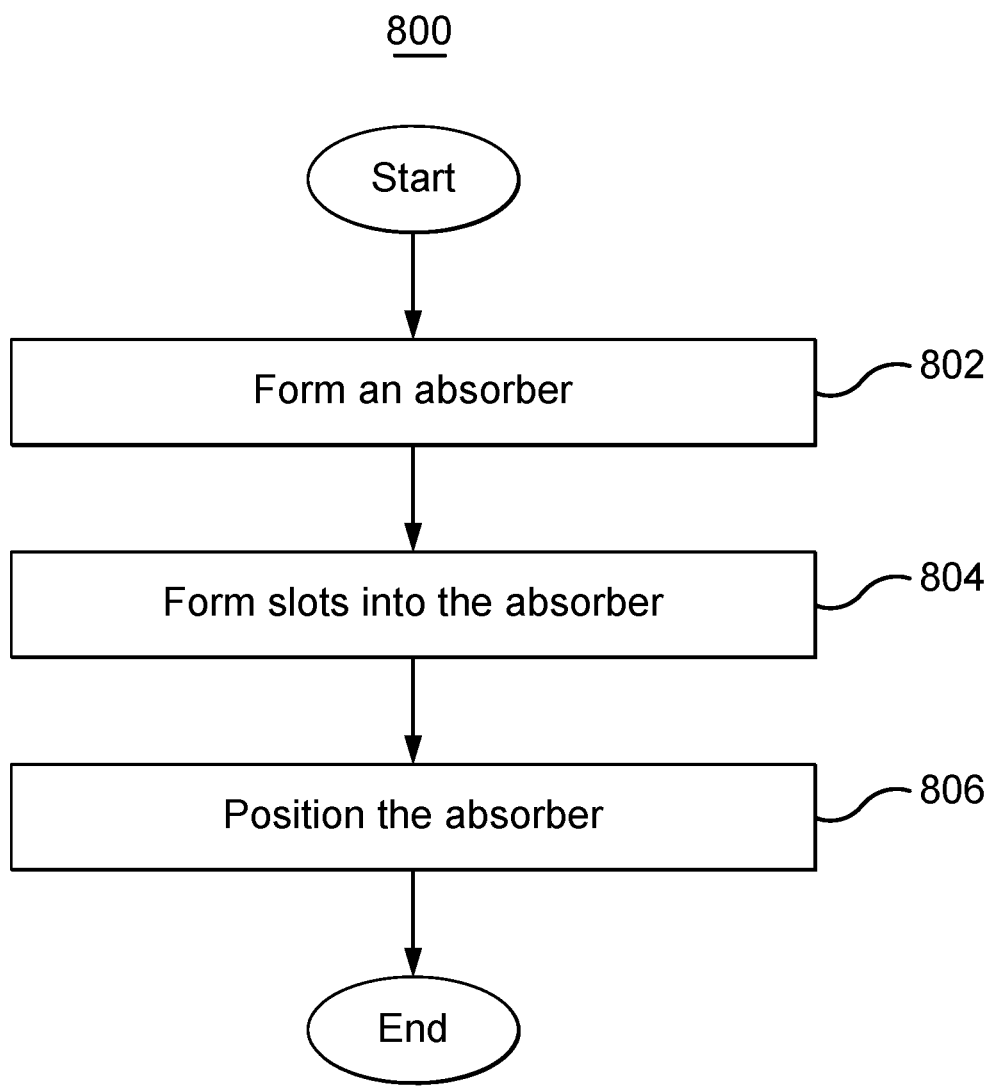
FIG. 8 is a flowchart of an example method performed in the systems of FIGS. 1 and 5.

FIG. 8 is a flowchart of an example method 800 performed in the systems 100 and 500 of FIGS. 1 and 5. In particular embodiments, a user or administrator of the systems 100 and 500 performs the method 800. By performing the method 800, a slotted absorber may be installed that increases the amount of electromagnetic radiation or noise absorbed in the systems 100 and 500.

In block 802, the user or administrator forms an absorber, and in block 804, slots are formed into the absorber. The absorber may be like the absorber 204 that includes a central cavity 206 through which an IC 202 extends. Additionally, the absorber 204 may define slots 310, 312, 314, and 316 around the body of the absorber 204. These slots 310, 312, 314, and 316 may improve the electromagnetic absorption of the absorber 204. As another example, the absorber may be like the absorber 506 with slots 602 or the slots 710, 712, 714, or 716 formed in the absorber 506. The slots 602, 710, 712, 714, and 716 may improve the noise absorption of the absorber 506.

The slots may be formed in the absorber using any suitable process. For example, the absorber may be formed as a solid sheet and the slots may be formed (e.g., cut) into the solid sheet. As another example, the absorber may be formed in a mold with protrusions that cause the absorber to form with the slots. The slots may extend to any suitable depth in the absorber. For example, the slots may extend partway through the absorber or completely through the absorber.

In block 806, the user or administrator positions the absorber. For example, the user or administrator may position the absorber 204 around the perimeter of an IC 202 on a board 102. The absorber 204 may define the central cavity 206 and the IC 202 may extend through the central cavity 206. As another example, the user or administrator may position the absorber 506 within an air vent 504 of a chassis 502. The absorber 506 may be positioned on a top surface or a bottom surface of the air vent 504. After positioning the absorber 204 or the absorber 506, the absorber 204 or the absorber 506 may absorb electromagnetic radiation produced by the IC 202 or noise produced by components in the chassis 502.

In summary, a slotted absorber defines a series of slots that extend across a length or width of the absorber. In certain embodiments, the slots improve the electromagnetic absorption of the absorber (e.g., by taking advantage of multireflection properties that increase the number of opportunities for the absorber to absorb electromagnetic radiation) or the noise absorption of the absorber. As an example, the absorber may define a central cavity so that the absorber may be installed around an IC to absorb electromagnetic radiation produced by the IC. As another example, the absorber may be installed in an air vent of a chassis to absorb noise emitted from the chassis.

In some embodiments, the slotted absorber provides around a 5 dB improvement in electromagnetic absorption relative to non-slotted absorbers in a 12 GHz application. Some slotted absorbers provide even more improvement at high frequencies. The slotted absorbers may also provide a 5 dB improvement for the 25.78 GHz and 26.56 GHz frequencies that may be experienced in an optical switch.

For example, in one test, an absorber is installed in the middle panel of a reverberation chamber, and total radiated power (TRP) is measured on the heatsink side. A coaxial connector is excited by one port of a network analyzer (e.g., a vector network analyzer), and the TRP is detected by an antenna connected to another port of the network analyzer. The heatsink is fixed on a board (e.g., by rubber band and/or thin double side tape on the lid of the chip). The difference in TRP measured with a slotted absorber and a solid absorber showed around a 5 dB reduction of TRP above 12 GHz. A slight offset in the results may be caused by the slot size deviation (e.g., if the slots were manually cut).

As another example, in another test, an absorber is installed in the air vent of a chassis to reduce noise leakage. Several sources inside the chassis were activated or excited to mimic noise. The noise level outside the chassis is then measured. The different in measured noise with a slotted absorber and a solid absorber showed a 41% reduction in measured noise volume. Additionally, the slotted absorber used 41% less material than the solid absorber. The slotted absorber also performed better than the solid absorber by 3 to 5 dB above 10 GHz, indicating that the slotted absorber is quite helpful to mitigate the most critical frequencies such as 25.78 GHz and 26.56 GHz in a 50G/100G/200G/400G optical switch. Although the solid absorber may outperform the slotted absorber below 10 GHz, the shielding effectiveness of a well-designed metal chassis may be sufficient to prevent noise leakage for frequency below 10 GHz. The absorber may be used for higher frequency (e.g., 25.78 GHZ, 26.56 GHZ, etc.) caused by high density/speed port and corresponding IC, so it may be valuable to achieve better performance in higher frequency.

For plastic absorbers, which are manufactured by molding, it may be easy to change the mold to produce any suitable slots. Furthermore, the absorber material quantity may be reduced by 30%-50%. For rubber or foam absorbers, which may be manufactured in a large sheet and cut into shapes, an extra process may be used to cut the slots. The tolerance requirement of the slot size may be low.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," or "at least one of A or B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

In view of the foregoing, the scope of the present disclosure is determined by the claims that follow.

We claim:

1. An electromagnetic absorber comprising:
   a body arranged to surround a perimeter of an integrated circuit chip, the body arranged to absorb electromagnetic radiation leaking from the integrated circuit chip, the body defining:
   an aperture through which the integrated circuit chip extends; and
   a first slot;
   a second slot;
   a third slot, wherein the first slot, the second slot, and the third slot extend along a length of the body, and wherein the first slot, the second slot, and the third slot are positioned, relative to each other, along a width of the body;
   a fourth slot;
   a fifth slot; and
   a sixth slot, wherein the fourth slot, the fifth slot, and the sixth slot extend along the width of the body, and wherein the fourth slot, the fifth slot, and the sixth slot are positioned, relative to each other, along the length of the body.

2. The electromagnetic absorber of claim 1, wherein the body comprises a first portion, a second portion opposite the first portion, a third portion attached to first portion and the second portion, and a fourth portion opposite the third portion and attached to the first portion and the second portion, wherein the first portion defines the first slot, the second slot, and the third slot, and wherein the third portion defines the fourth slot, the fifth slot, and the sixth slot.

3. The electromagnetic absorber of claim 2, wherein the first slot extends across a majority of the length of the body.

4. The electromagnetic absorber of claim 2, wherein the fourth slot extends across a majority of the width of the body.

5. The electromagnetic absorber of claim 2, wherein the first portion further defines a seventh slot and an eighth slot, wherein the seventh slot and the eighth slot extend along the length of the body and are positioned, relative to each other, along the width of the body, and wherein the seventh slot and the eighth slot are positioned relative to the first slot and the second slot along the length of the body.

6. The electromagnetic absorber of claim 1, wherein the first slot and the fourth slot extend through the body.

7. The electromagnetic absorber of claim 1, wherein the first slot and the fourth slot are rounded.

8. The electromagnetic absorber of claim 1, further comprising a heatsink positioned on the integrated circuit chip and the body.

9. An absorber comprising:
   a body defining a first slot, a second slot, and a third slot, wherein the first slot, the second slot, and the third slot extend along a length of the body, wherein the first slot, the second slot, and the third slot are positioned, relative to each other, along a width of the body, and wherein the body is arranged to be positioned in an air vent of a chassis such that the body absorbs acoustic noise produced from within the chassis.

10. The absorber of claim 9, wherein the body comprises a first portion, a second portion attached to the first portion, a third portion attached to the second portion, and a fourth portion attached to the third portion, wherein the first portion defines the first slot, the second slot, and the third slot, wherein the second portion defines a fourth slot, a fifth slot, and a sixth slot, wherein the fourth slot, the fifth slot, and the sixth slot extend along the length of the body, and wherein the fourth slot, the fifth slot, and the sixth slot are positioned, relative to each other, along the width of the body.

11. The absorber of claim 10, wherein the first slot, the second slot, and the third slot extend across a length of the first portion, and wherein the fourth slot, the fifth slot, and the sixth slot extend across a length of the second portion.

12. The absorber of claim 10, wherein the first slot, the second slot, and the third slot are aligned with the fourth slot, the fifth slot, and the sixth slot.

13. The absorber of claim 10, wherein the first slot, the second slot, and the third slot are arranged along a width of the first portion.

14. The absorber of claim 9, wherein the first slot, the second slot, and the third slot extend across a majority of the length of the body.

15. The absorber of claim 9, wherein the first slot, the second slot, and the third slot extend through the body.

16. A method comprising:
   forming an electromagnetic absorber that defines an aperture;
   forming, in the electromagnetic absorber, a first slot, a second slot, a third slot, a fourth slot, a fifth slot, and a sixth slot positioned around the aperture, wherein the first slot, the second slot, and the third slot extend along a length of the electromagnetic absorber, wherein the first slot, the second slot, and the third slot are positioned, relative to each other, along a width of the electromagnetic absorber, wherein the fourth slot, the fifth slot, and the sixth slot extend along the width of the electromagnetic absorber, and wherein the fourth slot, the fifth slot, and the sixth slot are positioned, relative to each other, along the length of the electromagnetic absorber; and
   positioning the electromagnetic absorber around an integrated circuit chip such that the integrated circuit chip extends into the aperture.

17. The method of claim 16, further comprising positioning a heatsink onto the integrated circuit chip and the electromagnetic absorber.

18. The method of claim 16, wherein the electromagnetic absorber comprises a first portion, a second portion opposite the first portion, a third portion attached to first portion and the second portion, and a fourth portion opposite the third portion and attached to the first portion and the second portion, wherein the first portion defines the first slot, the second slot, and the third slot, and wherein the third portion defines the fourth slot, the fifth slot, and the sixth slot.

19. The method of claim 18, wherein the first slot extends across a majority of the length of the electromagnetic absorber.

* * * * *

UNITED STATES PATENT AND TRADEMARK OFFICE
CERTIFICATE OF CORRECTION

| | | |
|---|---|---|
| PATENT NO. | : 12,317,465 B2 | Page 1 of 1 |
| APPLICATION NO. | : 18/059703 | |
| DATED | : May 27, 2025 | |
| INVENTOR(S) | : Jianquan Lou et al. | |

It is certified that error appears in the above-identified patent and that said Letters Patent is hereby corrected as shown below:

In the Claims

Under Column no. 9, Claim 1, Line no. 31, Replace:
"extends; and"
With:
--extends;--

Signed and Sealed this
Twelfth Day of August, 2025

Coke Morgan Stewart
*Acting Director of the United States Patent and Trademark Office*